United States Patent [19]

Lewis

[11] 3,731,140

[45] May 1, 1973

[54] MAGNETRONS

[75] Inventor: Peter Frederick Lewis, Chelmsford, England

[73] Assignee: English Electric Valve Company Limited, London, England

[22] Filed: July 14, 1971

[21] Appl. No.: 162,532

[30] Foreign Application Priority Data

Aug. 8, 1970 Great Britain ....................38,342/70

[52] U.S. Cl. ..............................315/39.61, 315/39.55

[51] Int. Cl. ..............................................H01j 25/50

[58] Field of Search ........................315/39.55, 39.61, 315/39.57, 39.59

[56] References Cited

UNITED STATES PATENTS

| | | | |
|---|---|---|---|
| 2,801,368 | 7/1957 | Brown | 315/39.61 |
| 3,028,522 | 4/1962 | Pease | 315/39.55 X |
| 2,816,248 | 12/1957 | Pease | 315/39.55 |
| 2,533,741 | 12/1950 | Okress | 315/39.61 |
| 3,412,285 | 11/1968 | Gerard | 315/39.61 |
| 2,466,765 | 4/1949 | Hartman | 315/39.61 X |
| 3,343,031 | 9/1967 | Backmark | 315/39.61 X |

*Primary Examiner*—Herman Karl Saalbach
*Assistant Examiner*—Saxfield Chatmon, Jr.
*Attorney*—Donald M. Wight et al.

[57] ABSTRACT

The invention is concerned with tunable multi cavity magnetrons and provides a tuning arrangement having only two movable tuning elements. Each of the elements is associated with one of a pair of adjacent cavities. The two movable elements are moved together and are arranged such that for any position of the tuning elements the two adjacent cavities are tuned to identical frequencies.

6 Claims, 2 Drawing Figures

Figure 1:
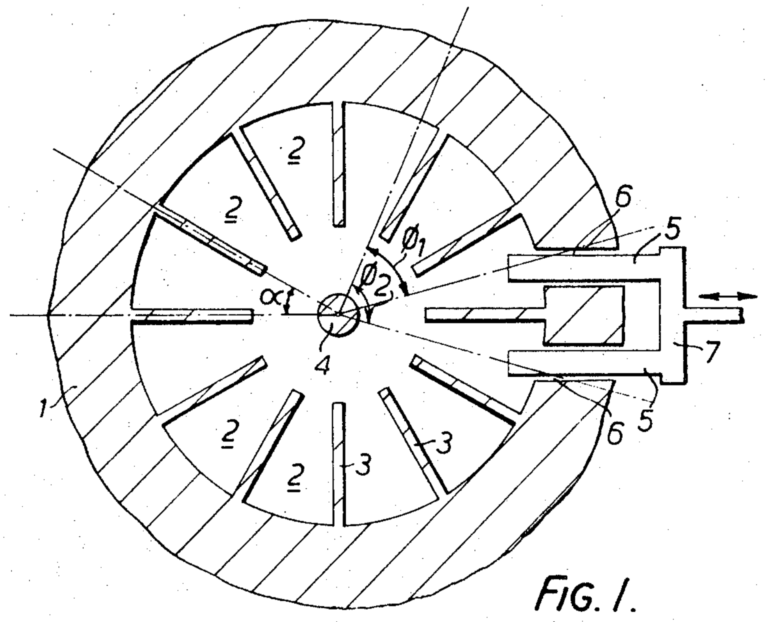

INVENTOR
Peter Frederick Lewis
BY
Baldwin Wight & Brown
ATTORNEYS

MAGNETRONS

This invention relates to tunable cavity magnetrons, hereinafter called, for the sake of brevity, simply tunable magnetrons, and has for its object to provide improved tunable magnetrons which shall be tunable over a relatively wide range of frequencies and which shall be nevertheless relatively simple mechanically and relatively easy to construct.

Tunable magnetrons are, of course, well known, and a wide variety of tuning arrangements has been proposed. In one well known type of tunable magnetron tuning is effected by means of a movable plunger in one of the cavities, the generated oscillation frequency being variable over a certain range of frequencies by moving the single plunger — usually radially with respect to the cathode. This type of tunable magnetron has considerable advantages in the matter of mechanical simplicity and ease of manufacture. It has, however, the defect that the tuning range is undesirably limited. Many other forms of tuning arrangement have accordingly been proposed in an effort to achieve a wider tuning range. Most of these proposals utilize mechanically moving tuning elements though in some proposals electronic tuning has been suggested. Although considerable success has been achieved in widening the tuning range it has been achieved only at the cost of considerable added mechanical complexity in the case of turners with mechanically moving tuning elements or at the cost of incurring electrical difficulties and disadvantages (and sometimes manufacturing difficulties as well) in the case of arrangements using electronic tuning. Because of this the type of arrangement with a single movable tuning element in one of the cavities is still, probably, the most favored type in practical use despite its limited tuning range. The present invention seeks to provide improved mechanically tunable magnetrons which shall be of little more mechanical complexity and little more difficulty of manufacture than is the known tunable magnetron of the single movable element type but which shall nevertheless provide, ceteris paribus, a wider tuning range than is provided by the said type.

Although the present invention is not dependent on the validity or otherwise of the theory now to be advanced it is believed that the main reason for the limitation of the tuning frequency range achievable by the single movable element type of tunable magnetron is that the movable tunable element in one cavity in effect produces distortion of the R.F. fields in the others as compared with that in the cavity containing said tuning element. It appears that the distortion may be written $x$ K sin $\theta$ where $\theta$ is the angular distance from the tuning device of the radius at which the distortion is measured; $x$ is the cavity sign characteristic and is $\pm 1$ for the cavities of a magnetron oscillating in the $\pi$ mode, adjacent cavities being of opposite sign characteristic so that if the cavity containing the tuning element is taken as $+1$, the adjacent cavities between which it is situated will have a sign characteristic of $-1$; and K is the amplitude factor of the distortion and is dependent on the physical shape and electrical characteristics of the tuning device and of the cavity which contains it. As will be seen later the present invention takes advantage of the fact that if $x$ is of one sign for one cavity it will be of the opposite sign for an adjacent cavity.

According to this invention a tunable magnetron having a plurality of cavities is provided with a tuning arrangement comprising only two movable tuning elements, one associated with each of two adjacent cavities, and means for adjusting the movable elements together the whole arrangement being such that the two cavities are for any position of the adjusting means, tuned to substantially the same frequency.

In one class of embodiment of this invention the tuning elements are conductive plungers, one in each of the two cavities and the adjusting means are constituted by means mechanically connected to both cavities for moving them together. A preferred form of tunable magnetron of this class has the cavities constituted by the spaces between equally angularly spaced radial vanes which are radial with respect to an axial cathode and which project inwardly from the main anode block of the magnetron, and the tuning elements are parallel conductive plungers which are slidable in holes in the anode block in directions parallel to one of the vanes which is situated mid-way between them, said plungers being mechanically connected to one another by a cross piece outside the block and being movable together to vary the extent of their projection into the cavities on either side of said vane.

In another class of embodiment of this invention one wall of each of the aforesaid two cavities is slotted recessed or otherwise formed to present a reactance to the cavity at the mouth of the slot recess or the like and each tuning element is constituted by a short-circuiting slider in said slot recess or the like and movable to vary the electrical length thereof and therefore the value of said reactance. One form of tunable magnetron of this class has the cavities constituted by the spaces between equally angularly spaced radial vanes which are radial with respect to an axial cathode and which project inwardly from the main anode block of the magnetron; the main anode block of the magnetron is provided with a pair of slots the larger opposite faces of which are parallel and in planes parallel to one of the vanes which is midway between them, each slot opening into one or other of the two cavities and the tuning elements are short-circuiting strip sliders, one in each slot, said sliders being slidable together in their slots.

The invention is illustrated in the accompanying drawings which show schematically and so far as is necessary to an understanding of the invention, two embodiments. Like references denote like parts in both figures.

Referring to FIG. 1, the magnetron therein represented has a mainly cylindrical anode block 1 with cavities 2, each of which is between two adjacent equally angularly spaced radial vanes 3 which project inwards from the block towards an axial cathode 4. In each of two only of the cavities is a plunger 5 of copper or other suitable metal. The plungers are slidable in holes 6 in the block so that their degree of penetration into their respective cavities is adjustable. They are tied together mechanically by a cross piece 7 outside the block and are adjustable by any suitable drive (not shown). The whole arrangement is such that the tuning of the two cavities is the same for any given position of adjustment.

Figure 2:
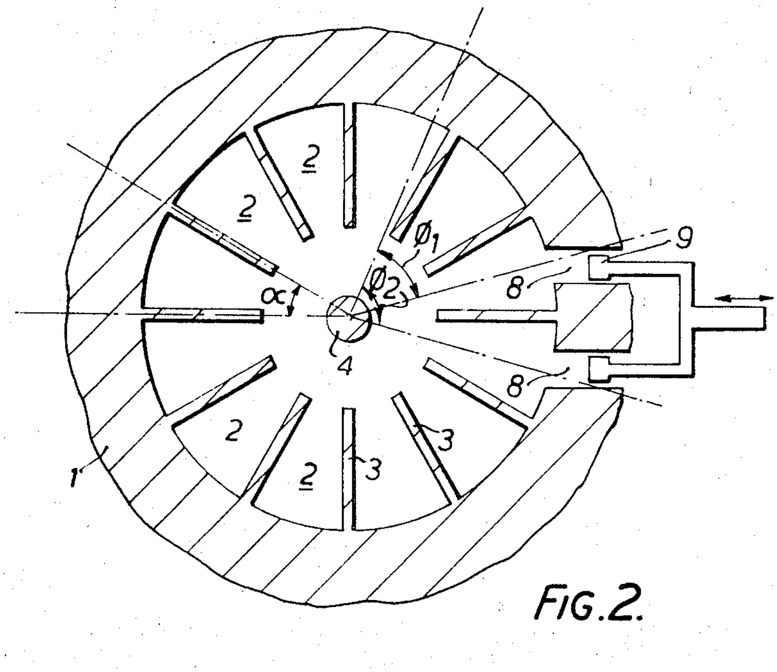

In the modification shown in FIG. 2 the plungers 5 of FIG. 1 are dispensed with and, instead, two slots 8 are provided as shown in the anode block. Each slot has its mouth opening into one or other of the two tunable cavities and will present a reactance at the mouth. The value of the reactances are variable together, for tuning purposes, by moving short circuiting sliders 9 together in an inwards or outwards direction. As will be apparent the effective lengths of the slots and therefore the values of the reactances are variable by varying the positions of the sliders. As before the sliders are movable together and the arrangement is such that matched tuning for both cavities is obtained.

Parts of the magnetrons not shown in the two figures may be in accordance with well-known practice.

In an arrangement in accordance with this invention, with two adjacent field cavities gang tuned, the distortion at any point will be $x_1K_1 \sin \theta_1 + x_2 K_2 \sin \theta_2$ where $x_1$, $K_1$ and $\theta_1$ are the values of the quantities $x$, K and $\theta$ respectively (already defined) with respect to one of the two cavities and $x_2$, $K_2$ and $\theta_2$ are the corresponding values with respect to the other. For clarity $\theta_1$ and $\theta_2$ are indicated in FIG. 1. Because the two cavities are adjacent, $x_1$ and $x_2$, will be of opposite sign. $K_1$ and $K_2$ are arranged to be as nearly as possible equal. If $\alpha$ (see FIG. 1) is the cavity angular displacement $\theta_2 = \theta_1 + \alpha$ and the field distortion will be $K_1 [\sin \theta_1 - \sin (\theta_1 + \alpha)]$. This will be, in practice, reasonably small in any event, the larger the number of cavities the smaller the value of $\alpha$ and therefore the smaller the field distortion. In a practical magnetron with twelve cavities, the invention reduces field distortion to a quite small amount, resulting in a relatively wide tuning frequency range in comparison with a tunable magnetron of the known simple single tunable element type with but little increase in mechanical complexity.

The invention is not limited to its application to radial vane magnetrons, but is applicable to other known types, e.g. to the well known "hole and slot" type whether "strapped" or not. It is applicable inter alia to those well known magnetrons in which alternate cavities are of one size and the others are of another e.g. to the so-called "rising sun" type of magnetron. In such cases, of course, the dimensions of one tuning element will be different from that of another in order that $K_1$ and $K_2$ (defined above) shall be equal.

I claim:

1. A tunable magnetron including a cathode and an anode having a plurality of cavities and which includes a tuning arrangement comprising only two movable tuning elements, one associated with each of two adjacent cavities, and means for adjusting the movable elements together the whole arrangement being such that the two cavities are for any position of the adjusting means, tuned to substantially the same frequency, said tuning elements being conductive plungers, one in each of the two cavities and the adjusting means being constituted by means mechanically connected to both plungers for moving them together, said cavities being constituted by the spaces between equally angularly spaced radial vanes which are radial with respect to said cathode and which project inwardly from the main anode block of the magnetron, and the tuning elements being parallel conductive plungers which are slidable in holes in the anode block in directions parallel to one of the vanes which is situated mid-way between them, said plungers being mechanically connected to one another by a cross piece outside the block and being movable together to vary the extent of their projection into the cavities on either side of said vane.

2. A tunable magnetron including a cathode and an anode having a plurality of cavities and which includes a tuning arrangement comprising only two movable tuning elements, one associated with each of two adjacent cavities, and means for adjusting the movable elements together the whole arrangement being such that the two cavities are for any position of the adjusting means, tuned to substantially the same frequency one wall of each of the said two cavities being slotted recessed or otherwise formed to present a reactance to the cavity at the mouth of the slot recess and each tuning element being constituted by a short-circuiting slider in said slot recess and movable to vary the electrical length thereof and therefore the value of said reactance.

3. A tunable magnetron as claimed in claim 2 wherein the cavities are constituted by the spaces between equally angularly spaced radial vanes which are radial with respect to said cathode and which project inwardly from the main anode block of the magnetron; the main anode block of the magnetron is provided with a pair of slots the larger opposite faces of which are parallel and in planes parallel to one of the vanes which is midway between them, each slot opening into one or other of the two cavities and the tuning elements are short-circuiting strip sliders, one in each slot, said sliders being slidable together in their slots.

4. In a tunable magnetron of the type including a cylindrical cathode; and an anode structure coaxially surrounding said cathode to define an interaction space therebetween, said anode structure presenting a multiplicity of cavities arranged in side-by-side circumferentially spaced relation around said interaction space and opening thereinto; and the magnetron being capable of producing a frequency output which is tunable over a limited frequency range by means of a movable plunger in one of said cavities; the improvement which comprises:

tuning means movable radially toward and away from said cathode for simultaneously varying the tuning in each of an adjacent pair of said cavities through values which produce a magnetron frequency output variable over a range substantially greater than said limited frequency range.

5. In a tunable magnetron as defined in claim 4 wherein the cavities defining said adjacent pair thereof are separated by a vane extending radially toward said cathode, and said tuning means comprises a pair of plungers each received in a respective one of said pair of cavities and each slidably mounted for movement parallel to said vane, and a cross piece interconnecting said plungers.

6. In a tunable magnetron as defined in claim 4 wherein the cavities defining said adjacent pair thereof are each provided with a slot opening thereinto, and said tuning means comprises a pair of sliders engaged in respective ones of such slots, and a cross piece interconnecting said sliders.

* * * * *